(12) United States Patent
Shindo

(10) Patent No.: US 11,491,639 B2
(45) Date of Patent: Nov. 8, 2022

(54) EXTENDABLE DEVICE

(71) Applicant: Tokyo Electron Limited, Tokyo (JP)

(72) Inventor: Takehiro Shindo, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/977,473

(22) PCT Filed: Jul. 12, 2019

(86) PCT No.: PCT/JP2019/027719
§ 371 (c)(1),
(2) Date: Sep. 2, 2020

(87) PCT Pub. No.: WO2020/022107
PCT Pub. Date: Jan. 30, 2020

(65) Prior Publication Data
US 2021/0220989 A1 Jul. 22, 2021

(30) Foreign Application Priority Data

Jul. 23, 2018 (JP) .............................. JP2018-137807

(51) Int. Cl.
*B25J 9/02* (2006.01)
*F16H 7/02* (2006.01)
(Continued)

(52) U.S. Cl.
CPC .................. *B25J 9/02* (2013.01); *F16H 7/02* (2013.01); *F16H 25/2018* (2013.01);
(Continued)

(58) Field of Classification Search
CPC ..... F16H 2025/2081; F16H 2025/2053; F16H 2025/2059
See application file for complete search history.

(56) References Cited

U.S. PATENT DOCUMENTS 1,748,948 A * 3/1930 Gassen .................. F16H 25/20
74/89.41
5,937,699 A * 8/1999 Garrec .................. B25J 18/025
74/89.35
(Continued)

FOREIGN PATENT DOCUMENTS

JP 09-029670 A 2/1997
JP 2000-117667 A 4/2000
(Continued)

OTHER PUBLICATIONS

International Search Report and Written Opinion dated Oct. 8, 2019 for PCT/JP2019/027719 filed on Jul. 12, 2019, 10 pages including English Translation of the International Search Report.

*Primary Examiner* — Jake Cook
(74) *Attorney, Agent, or Firm* — Xsensus LLP

(57) ABSTRACT

This extendable device includes: a base member; a first ball screw that is provided to the base member and that rotates according to a driving force supplied from a drive source; a first movable member that is coupled to the base member via the first ball screw and that moves relative to the base member as the first ball screw rotates; a second ball screw that is provided to the first movable member and that rotates as the first movable member moves; a third ball screw that is provided to the first movable member; a transmission mechanism that transmits the rotation of the second ball screw to the third ball screw; and a second movable member that is coupled to the first movable member via the third ball screw and that moves relative to the first movable member as the third ball screw rotates.

14 Claims, 8 Drawing Sheets

(51) Int. Cl.
 *F16H 25/20* (2006.01)
 *F16H 25/22* (2006.01)
 *F16H 37/14* (2006.01)
 *F16H 55/36* (2006.01)

(52) U.S. Cl.
 CPC ......... *F16H 25/2204* (2013.01); *F16H 37/14* (2013.01); *F16H 55/36* (2013.01); *F16H 2025/2081* (2013.01)

(56) References Cited

U.S. PATENT DOCUMENTS

| | | | |
|---|---|---|---|
| 6,382,039 B1* | 5/2002 | Choi | F16H 25/20 414/547 |
| 9,878,889 B2* | 1/2018 | Watson | E04G 1/22 |
| 2007/0295126 A1* | 12/2007 | Wang | F16H 25/20 74/89.35 |
| 2015/0075306 A1 | 3/2015 | Castelli et al. | |

FOREIGN PATENT DOCUMENTS

| | | | |
|---|---|---|---|
| JP | 2010-090987 A | 4/2010 |
| JP | 2010-131199 A | 6/2010 |
| JP | 2015-143525 A | 8/2015 |
| JP | 2016-211666 A | 12/2016 |

\* cited by examiner

CROSS-SECTION A-A

CROSS-SECTION B-B

CROSS-SECTION C-C

CROSS-SECTION D-D

EXTENDABLE DEVICE

CROSS-REFERENCE TO RELATED APPLICATIONS

This application is national stage application of International Application No. PCT/JP2019/027719, filed Jul. 12, 2019, which designates the United States, incorporated herein by reference, and which claims the benefit of priority from Japanese Patent Application No. 2018-137807, filed Jul. 23, 2018, the entire contents of each are incorporated herein by reference.

FIELD

Various aspects and embodiments of the present disclosure relate to an extendable device.

BACKGROUND

Conventionally, an extendable device that extends and contracts in a height direction or a horizontal direction has been used for substrate conveying robots. For example, in an extendable device that extends and contracts in a height direction, a first ball screw is provided on a fixed support column serving as a base, for example, and a first movable support column is coupled to the fixed support column via a first ball screw. In addition, a second ball screw that is coupled to the first ball screw via a predetermined transmission mechanism is provided to the first movable support column, and a second movable support column is coupled to the first movable support column via a second ball screw. Furthermore, a motor constituting a drive source is attached to the first movable support column. Further, through rotation of the thread of the first ball screw and the threaded shaft of the second ball screw according to a driving force supplied from the motor attached to the first movable support column, the first movable support column moves up and down with respect to the fixed support column, and the second movable support column moves up and down with respect to the first movable support column.

However, in the foregoing technology, because the motor constituting the drive source is attached to the first movable support column, a load including the weight of the motor itself is applied to the motor when the first movable support column and the second movable support column are moving. When the load including the weight of the motor itself is applied to the motor, there is a reduction in the rotational speeds of the first ball screw and second ball screw which rotate according to the driving force supplied from the motor. As a result, there is a reduction in the speeds of movement of the first movable support column and second movable support column, thereby hindering a high-speed extension/contraction operation. Note that, although problems pertaining to an extendable device that extends and contracts in a height direction are described here, similar problems also arise with an extendable device that extends and contracts in a horizontal direction.

SUMMARY

An extendable device includes: a base member; a first ball screw that is provided to the base member and that rotates according to a driving force supplied from a drive source; a first movable member that is coupled to the base member via the first ball screw and that moves relative to the base member as the first ball screw rotates; a second ball screw that is provided to the first movable member and that rotates as the first movable member moves; a third ball screw that is provided to the first movable member; a transmission mechanism that transmits the rotation of the second ball screw to the third ball screw; and a second movable member that is coupled to the first movable member via the third ball screw and that moves relative to the first movable member as the third ball screw rotates.

DESCRIPTION OF EMBODIMENT

Exemplary embodiment of the extendable device disclosed in the present application will be described in detail hereinbelow with reference to the drawings. Note that the same reference signs are assigned to the same or equivalent parts in each of the drawings.

Figure 1:
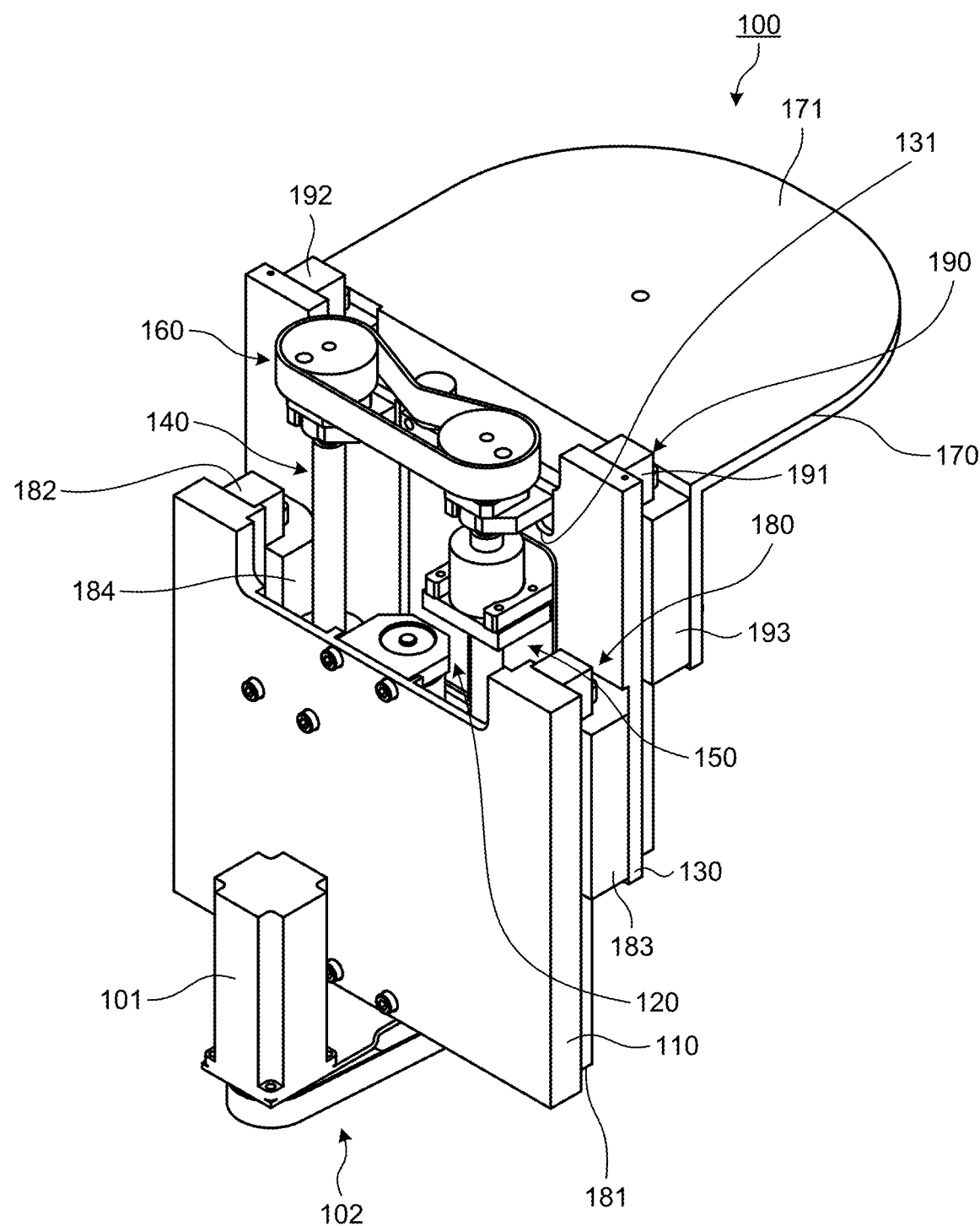
FIG. 1 is a perspective view in a case where an extendable device according to the present embodiment is viewed from the front.
Figure 2:
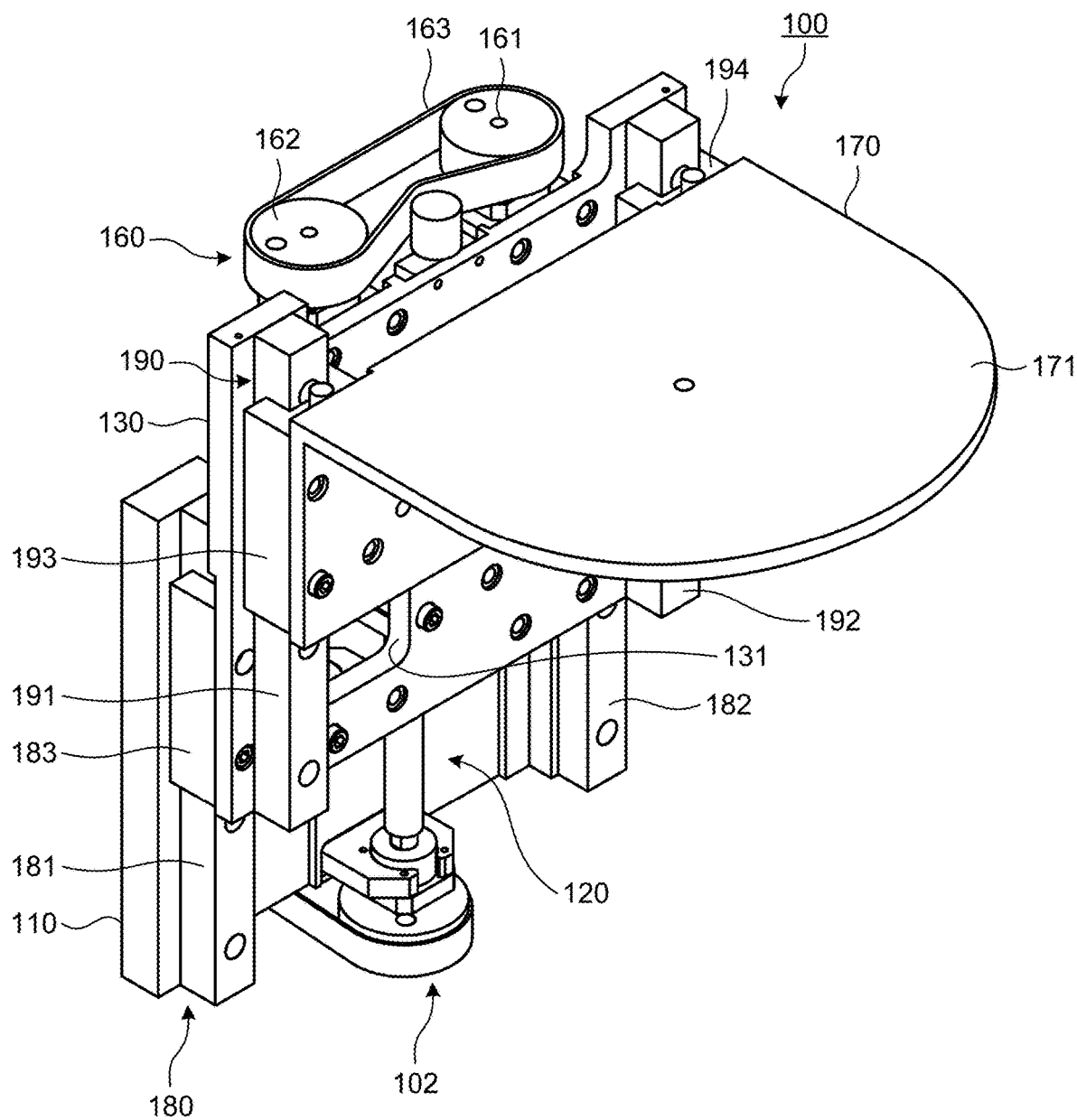
FIG. 2 is a perspective view in a case where the extendable device according to the present embodiment is viewed from the rear.
Figure 3:
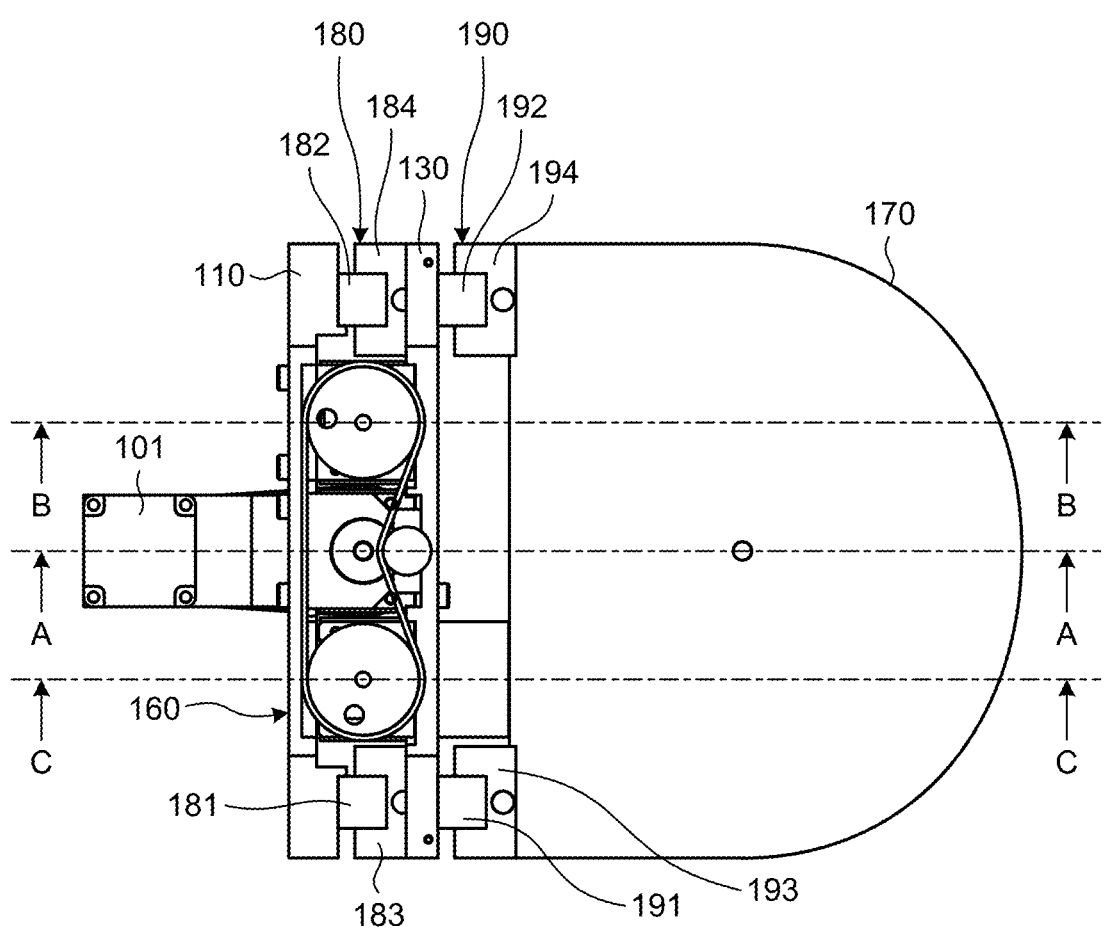
FIG. 3 is a planar view of the extendable device according to the present embodiment.
Figure 4:
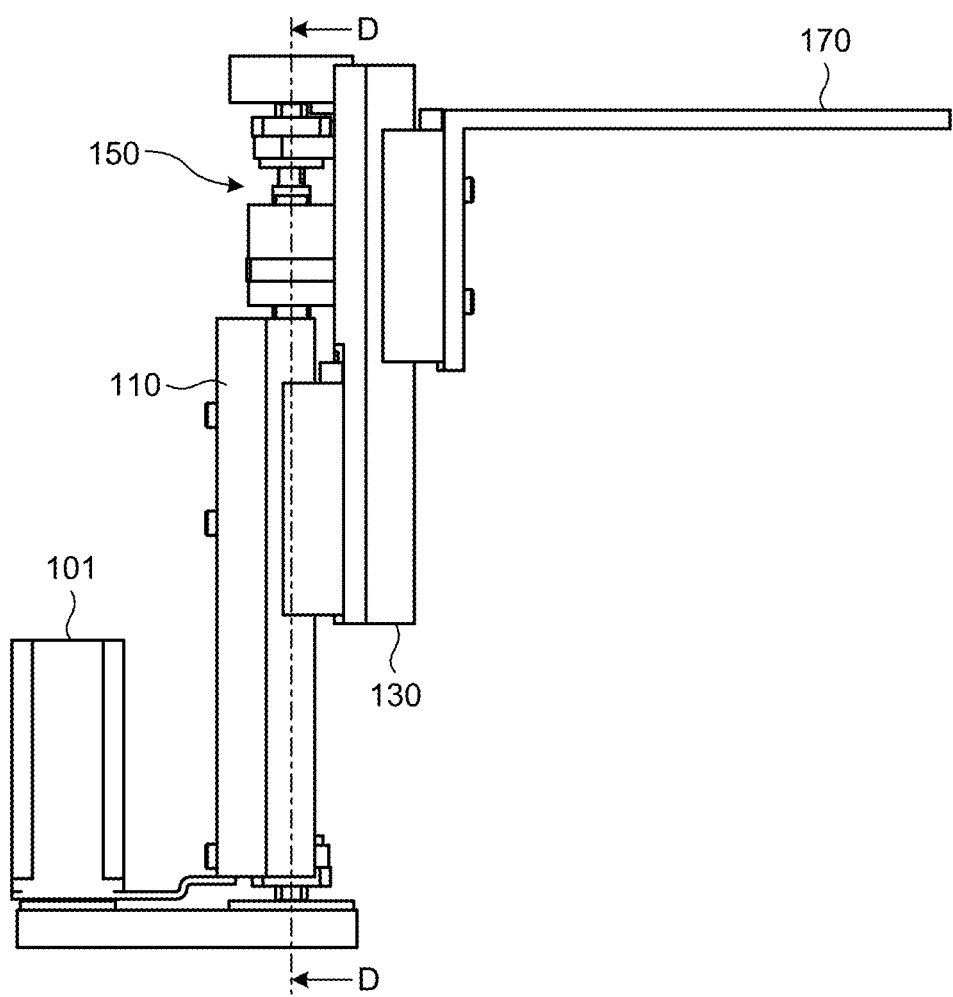
FIG. 4 is a side elevation of the extendable device according to the present embodiment.

FIG. 1 is a perspective view in a case where an extendable device 100 according to the present embodiment is viewed from the front. FIG. 2 is a perspective view in a case where the extendable device 100 according to the present embodiment is viewed from the rear. FIG. 3 is a planar view of the extendable device 100 according to the present embodiment. FIG. 4 is a side elevation of the extendable device 100 according to the present embodiment.

As illustrated in FIGS. 1 to 4, the extendable device 100 is coupled via a coupling mechanism 102 to a motor 101 which is a drive source separate from the extendable device 100, and extends and contracts in a height direction upon receiving a driving force supplied from the motor 101. The extendable device 100 includes a base member 110, a first ball screw 120, a first movable member 130, a second ball screw 140, a third ball screw 150, a transmission mechanism 160, a second movable member 170, a first guide mechanism 180 and a second guide mechanism 190.

The base member 110 is a plate-shaped member that is fixed so as to stand upright on a flat surface such as a floor, for example.

The first ball screw 120 is provided to the base member 110. The first ball screw 120 is coupled to the motor 101 via the coupling mechanism 102 in a state where the motor 101 is disposed separately from the first movable member 130 and the second movable member 170 and rotates according to the driving force supplied from the motor 101. Note that the coupling mechanism 102 includes a pulley that is attached to the output shaft of the motor 101, a pulley that is attached to the threaded shaft of the first ball screw 120, and a belt that couples together these two pulleys.

The first movable member 130 is a plate-shaped member that is coupled to the base member 110 via the first ball screw 120. Further, the first movable member 130 moves relative to the base member 110 as the first ball screw 120 rotates. In the present embodiment, the first movable member 130 moves up and down along the height direction of the base member 110. A specific configuration of parts coupling together the base member 110 and the first movable member 130 will be described in detail subsequently.

The second ball screw 140 is provided to the first movable member 130 and rotates as the first movable member 130 moves.

The third ball screw 150 is provided to the first movable member 130.

The transmission mechanism 160 transmits the rotation of the second ball screw 140 to the third ball screw 150.

The second movable member 170 is a plate-shaped member which is bent in an L shape and has a planar section 171 for mounting other components such as a conveying arm, for example. The second movable member 170 is coupled to the first movable member 130 via the third ball screw 150. Further, the second movable member 170 moves relative to the first movable member 130 as the third ball screw 150 rotates. In the present embodiment, the second movable member 170 moves up and down along the height direction of the first movable member 130. A specific configuration of the parts coupling together the first movable member 130 and the second movable member 170 will be described in detail subsequently.

Further, the first guide mechanism 180 guides the movement of the first movable member 130 with respect to the base member 110. More specifically, the first guide mechanism 180 has a pair of guide rails 181 and 182, and a pair of guide blocks 183 and 184. The pair of guide rails 181 and 182 are attached to the base member 110 and extend in the height direction of the base member 110. The pair of guide blocks 183 and 184 are attached to the first movable member 130 and are slidably coupled to the pair of guide rails 181 and 182. As a result of the pair of guide blocks 183 and 184 sliding on the pair of guide rails 181 and 182, the first movable member 130 is guided by the pair of guide rails 181 and 182 while moving up and down along the height direction of the base member 110.

The second guide mechanism 190 guides the movement of the second movable member 170 with respect to the first movable member 130. More specifically, the second guide mechanism 190 has a pair of guide rails 191 and 192, and a pair of guide blocks 193 and 194. The pair of guide rails 191 and 192 are attached to the first movable member 130 and extend in the height direction of the first movable member 130. The pair of guide blocks 193 and 194 are attached to the second movable member 170 and are slidably coupled to the pair of guide rails 191 and 192. As a result of the pair of guide blocks 193 and 194 sliding on the pair of guide rails 191 and 192, the second movable member 170 is guided by the pair of guide rails 191 and 192 while moving up and down along the height direction of the first movable member 130.

Figure 5:
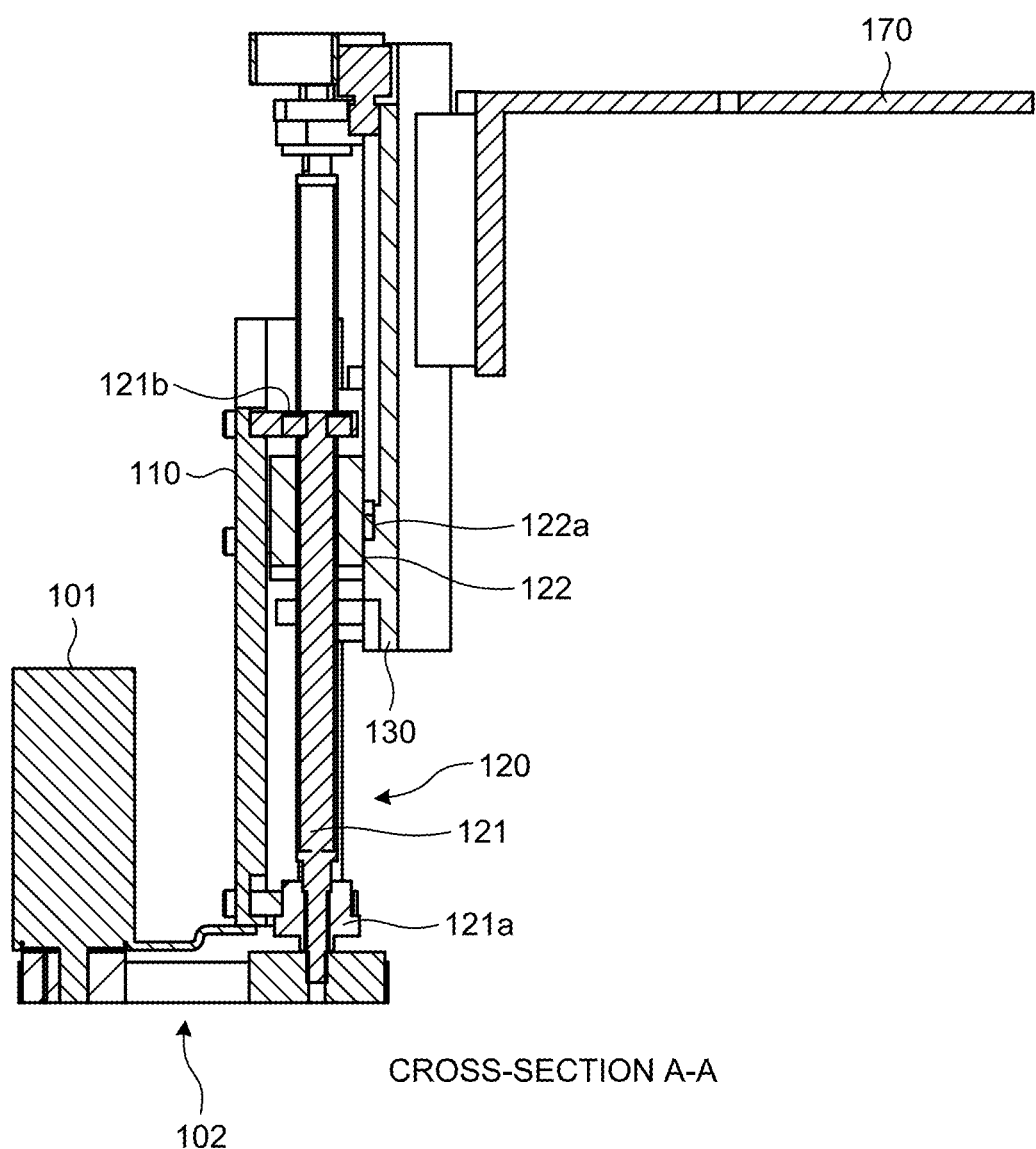
FIG. 5 is a diagram illustrating a configuration of parts coupling together a base member and a first movable member, according to the present embodiment.

Next, the parts coupling together the base member 110 and the first movable member 130 will be described in detail with reference to FIG. 5. FIG. 5 is a diagram illustrating a configuration of parts coupling together the base member 110 and the first movable member 130, according to the present embodiment. Note that FIG. 5 illustrates a cross-section along line A-A in FIG. 3.

As illustrated in FIG. 5, the first ball screw 120 provided to the base member 110 has a threaded shaft 121 and a nut 122. The threaded shaft 121 is rotatably fixed to the base member 110 via fixing members 121a and 121b, and the end of the threaded shaft 121 is coupled to the output shaft of the motor 101 via the coupling mechanism 102.

The nut 122 is attached to the threaded shaft 121 and fixed to the first movable member 130 via a fixing member 122a. Thus, the first movable member 130 is coupled to the base member 110 via the first ball screw 120 (the threaded shaft 121 and the nut 122). Further, the threaded shaft 121 of the first ball screw 120 rotates according to the driving force supplied from the motor 101, and the nut 122 causes the first movable member 130 to move along the threaded shaft 121 as the threaded shaft 121 rotates.

Thus, in the extendable device 100, the motor 101 is disposed separately from the first movable member 130, and the first movable member 130 moves relative to the base member 110 as the first ball screw 120 rotates using the driving force supplied from the motor 101. Hence, when the first movable member 130 moves, a reduction in the rotational speed of the first ball screw 120 is suppressed without the load including the weight of the motor 101 itself acting on the motor 101. As a result, a reduction in the speed of movement of the first movable member 130 is suppressed, thereby enabling a high-speed extension/contraction operation to be realized.

Figure 6:
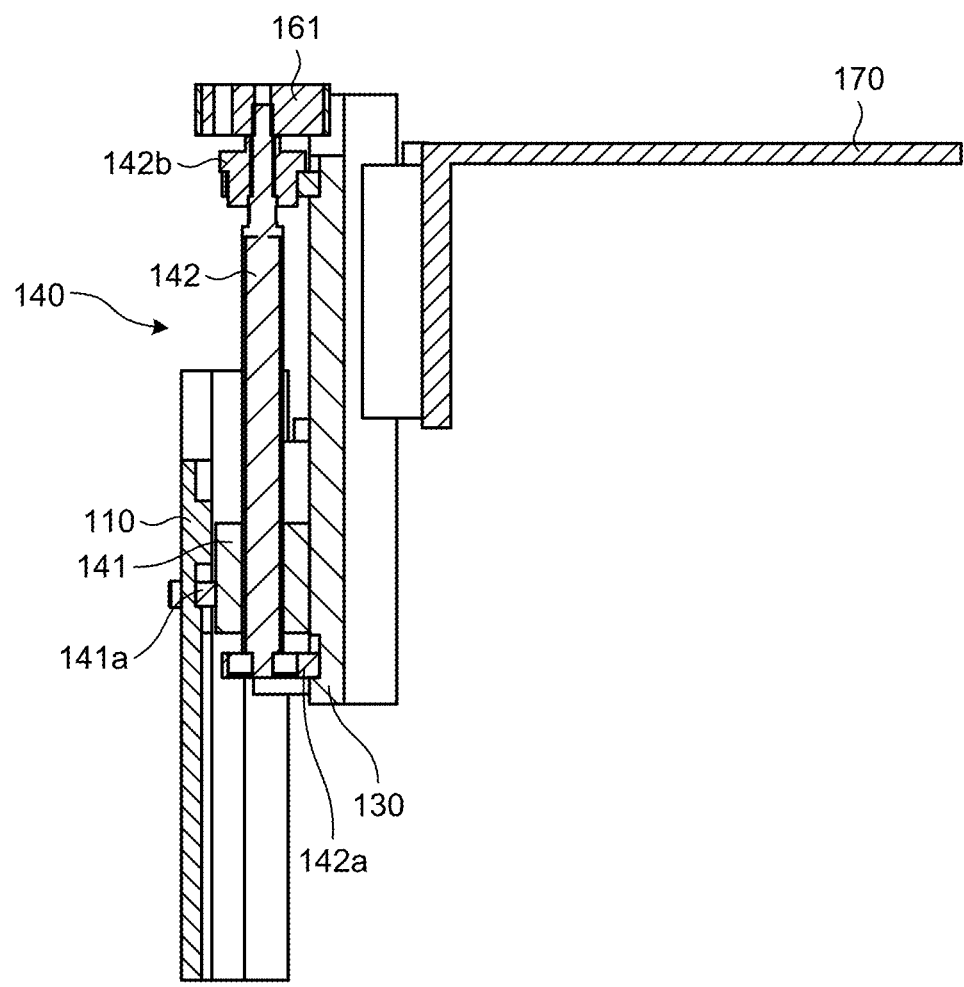
FIG. 6 is a diagram illustrating a configuration of parts coupling together the first movable member and a second movable member, according to the present embodiment.
Figure 7:
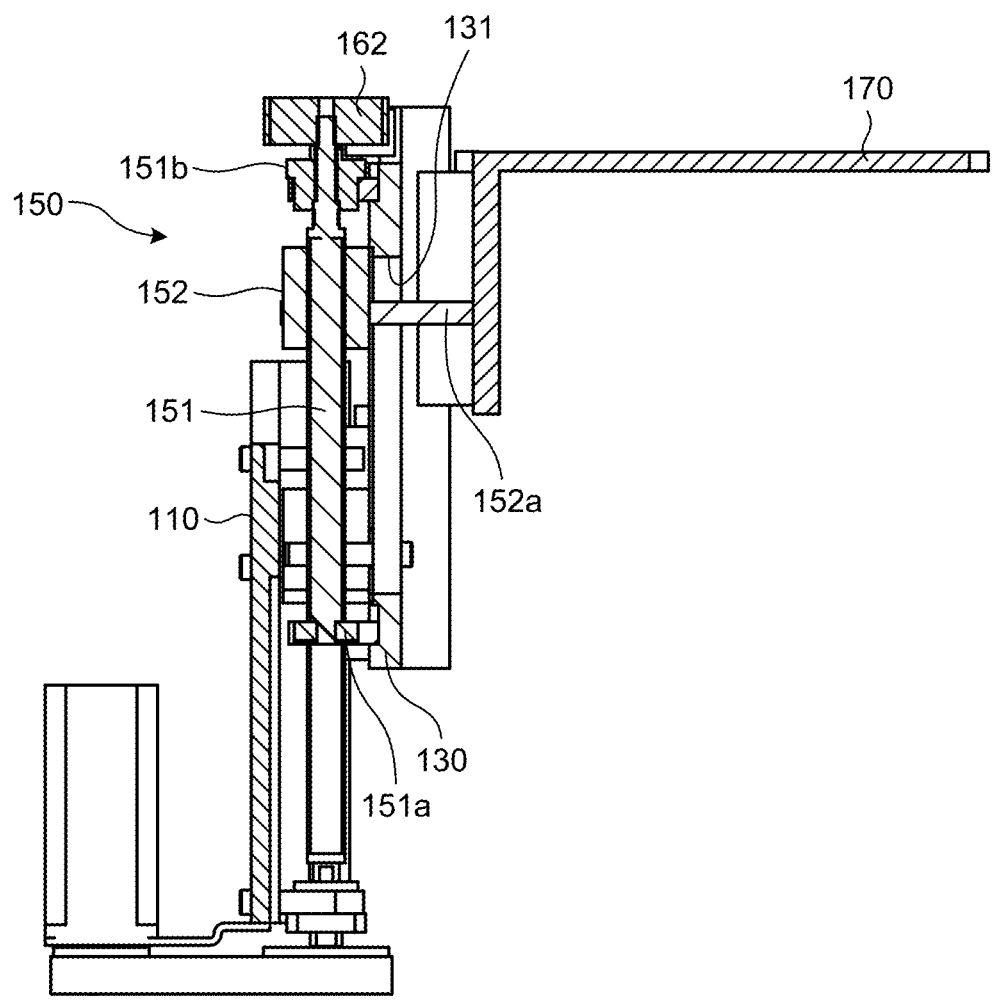
FIG. 7 is a diagram illustrating a configuration of parts coupling together the first movable member and the second movable member, according to the present embodiment.
Figure 8:
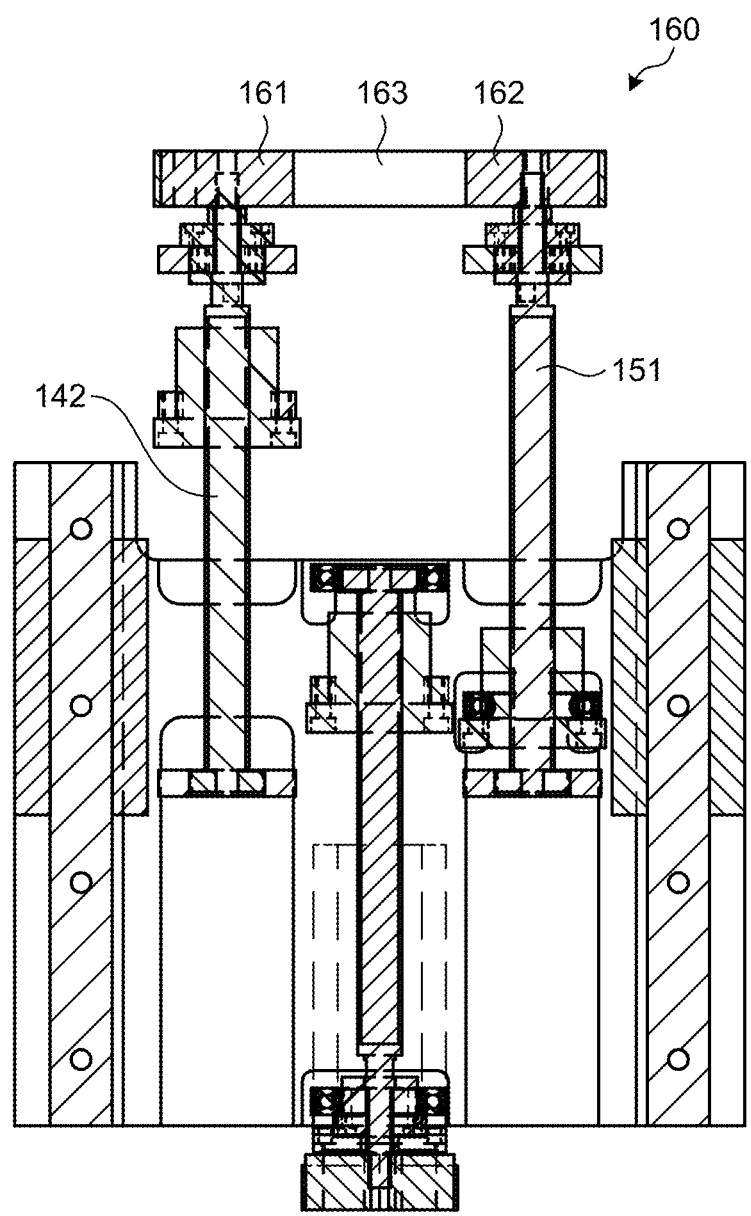
FIG. 8 is a diagram illustrating a configuration of parts coupling together the first movable member and the second movable member, according to the present embodiment.

Next, the parts coupling together the first movable member 130 and the second movable member 170 will be described in detail with reference to FIGS. 6 to 8. FIGS. 6 to 8 are diagrams illustrating configurations of parts coupling together the first movable member 130 and the second movable member 170, according to the present embodiment. Note that FIG. 6 illustrates a cross-section along line B-B in FIG. 3; FIG. 7 illustrates a cross-section along line C-C in FIG. 3; and FIG. 8 illustrates a cross-section along line D-D in FIG. 4.

As illustrated in FIG. 6, the second ball screw 140 provided to the first movable member 130 has a nut 141 and a threaded shaft 142. The nut 141 is fixed to the base member 110 via a fixing member 141a.

The threaded shaft 142 is attached to the nut 141 and rotatably fixed to the first movable member 130 via the fixing members 142a and 142b.

As illustrated in FIG. 7, the third ball screw 150 provided to the first movable member 130 has a threaded shaft 151 and a nut 152. The threaded shaft 151 is rotatably fixed to the first movable member 130 via fixing members 151a and 151b.

The nut 152 is attached to the threaded shaft 151 and fixed to the second movable member 170 via a fixing member 152a. The fixing member 152a is inserted into a through-hole 131 that is formed in an area of the first movable member 130 which corresponds to the threaded shaft 151, thereby coupling together the nut 152 and the second movable member 170. Thus, the second movable member 170 is coupled to the first movable member 130 via the third ball screw 150 (the threaded shaft 151 and the nut 152).

In addition, the threaded shaft 142 of the second ball screw 140 and the threaded shaft 151 of the third ball screw 150 are coupled to each other by the transmission mechanism 160 as illustrated in FIG. 8. In other words, the transmission mechanism 160 has a first pulley 161, a second pulley 162, and a transmission belt 163. The first pulley 161 is attached to the threaded shaft 142 of the second ball screw 140. The second pulley 162 is attached to the threaded shaft 151 of the third ball screw 150. The first pulley 161 and second pulley 162 are of the same diameter and are coupled to each other by the transmission belt 163. When the first movable member 130 moves, the threaded shaft 142 of the second ball screw 140 rotates, and the first pulley 161 rotates as the threaded shaft 142 of the second ball screw 140 rotates. The rotation of the first pulley 161 is transmitted by the transmission belt 163 to the second pulley 162. The second pulley 162 rotates as a result of the rotation of the first pulley 161 being transmitted to the second pulley 162. Further, the threaded shaft 151 of the third ball screw 150 rotates as the second pulley 162 rotates, and the nut 152 causes the second movable member 170 to move along the threaded shaft 151. Here, the first pulley 161 and the second pulley 162 are of the same diameter, and the speed of movement of the first movable member 130 and the speed of movement of the second movable member 170 are identical.

Thus, in the extendable device 100, the motor 101 is disposed separately from the second movable member 170, and the second movable member 170 moves relative to the first movable member 130 as the third ball screw 150 rotates on the basis of the movement of the first movable member 130. Hence, when the second movable member 170 moves, a reduction in the rotational speed of the third ball screw 150 is suppressed without the load including the weight of the motor 101 itself acting on the motor 101. As a result, a reduction in the speed of movement of the second movable member 170 is suppressed, thereby enabling a high-speed extension/contraction operation to be realized.

According to the present embodiment hereinabove, the first movable member 130 is made to move relative to the base member 110 as the first ball screw 120 rotates using the driving force supplied from the motor 101 which is separate from the first movable member 130. Furthermore, according to the present embodiment, the rotation of the second ball screw 140, which moves together with the movement of the first movable member 130, is transmitted to the third ball screw 150 by the transmission mechanism 160, and the second movable member 170 is made to move relative to the first movable member 130 as the third ball screw 150 rotates. Hence, when the first movable member 130 and the second movable member 170 move, a reduction in the rotational speeds of the first ball screw 120 and third ball screw 150 is suppressed without the load including the weight of the motor 101 itself acting on the motor 101. As a result, a reduction in the speeds of movement of the first movable member 130 and the second movable member 170 is suppressed, thereby enabling a high-speed extension/contraction operation to be realized.

In addition, according to the present embodiment, because the motor 101 does not move, the burden that acts on the power supply cable connected to the motor 101 can be reduced and the lifespan of the power supply cable can be extended.

Furthermore, in a case where the extendable device 100 according to the present embodiment is disposed in a vacuum device, because the motor 101 can be disposed separate from the extendable device 100, it is not necessary for the motor 101 to be disposed inside the vacuum device. It is therefore possible to place the motor 101 in an atmospheric environment.

Moreover, according to the present embodiment, because the first movable member 130 is coupled to the base member 110 and the second movable member 170 is coupled to the first movable member 130, the stroke length can be made large.

Note that, although the speed of movement of the first movable member 130 and the speed of movement of the second movable member 170 are identical in the foregoing embodiment, the ratio of the speed of movement of the second movable member 170 to the speed of movement of the first movable member 130 may be modified. That is, the first pulley 161 and second pulley 162 which are illustrated in FIG. 8 may also be of different diameters. In addition, the threaded shaft 142 of the second ball screw 140 illustrated in FIG. 8 and the threaded shaft 151 of the third ball screw 150 may also have different thread groove pitches.

Moreover, although the extendable device 100 extends and contracts in the height direction in the foregoing embodiment, same may also extend and contract in the horizontal direction. In this case, the base member 110 illustrated in FIG. 1 is fixed parallel to a flat surface such as a floor, for example.

One aspect of the disclosed extendable device affords the advantageous effect of enabling a high-speed extension/contraction operation to be realized.

While certain embodiment has been described, this embodiment has been presented by way of example only, and is not intended to limit the scope of the disclosures. Indeed, the embodiment described herein may be embodied in a variety of other forms. Furthermore, various omissions, substitutions and changes in the form of the embodiment described herein may be made without departing from the spirit of the disclosures. The accompanying claims and their equivalents are intended to cover such forms or modifications as would fall within the scope and spirit of the disclosures.

The invention claimed is:

1. An extendable device, comprising:
a base member;
a first ball screw that is provided at a back surface of the base member and that rotates according to a driving force supplied from a drive source;
a first movable member that is coupled to the base member via the first ball screw and that moves relative to the base member as the first ball screw rotates, the first movable member being a plate-shaped member in parallel to the base member;
a second ball screw that is provided at a front surface of the first movable member facing the back surface of the base member, and that rotates as the first movable member moves;
a third ball screw that is provided at the front surface of the first movable member;
a transmission mechanism that transmits the rotation of the second ball screw to the third ball screw;
a second movable member that is coupled to the first movable member via the third ball screw and that moves relative to the first movable member as the third ball screw rotates; and
a first guide mechanism that is provided between the base member and the first movable member and that guides the movement of the first movable member with respect to the base member,
wherein the first ball screw, the second ball screw and the third ball screw are disposed between the first movable member and the base member, and
the third ball screw and the second movable member are coupled via a through-hole formed in the first movable member.

2. The extendable device according to claim 1, wherein the drive source is disposed away from front surface of the base member opposite to the back surface of the base member.

3. The extendable device according to claim 1, wherein the first ball screw has:
a threaded shaft that is rotatably fixed to the base member and that rotates according to the driving force supplied from the drive source; and
a nut that is attached to the threaded shaft, that is fixed to the first movable member, and that causes the first movable member to move along the threaded shaft as the threaded shaft rotates.

4. The extendable device according to claim 1, wherein the second ball screw has:
a nut that is fixed to the base member; and
a threaded shaft that is attached to the nut, that is rotatably fixed to the first movable member, and that rotates as the first movable member moves,
the third ball screw has:
a threaded shaft that is rotatably fixed to the first movable member and that rotates as a result of the rotation of the threaded shaft of the second ball screw being transmitted by the transmission mechanism; and
a nut that is attached to the threaded shaft, that is fixed to the second movable member via the through-hole of the first movable member, and that causes the second movable member to move along the threaded shaft as the threaded shaft rotates, and
the transmission mechanism has:
a first pulley that is attached to the threaded shaft of the second ball screw;
a second pulley that is attached to the threaded shaft of the third ball screw; and
a belt that couples together the first pulley and the second pulley.

5. The extendable device according to claim 4, wherein the first pulley and the second pulley are of different diameters.

6. The extendable device according to claim 4, wherein the threaded shaft of the second ball screw and the threaded shaft of the third ball screw have different thread groove pitches.

7. The extendable device according to claim 1, further comprising:
a second guide mechanism that is provided between the first movable member and the second movable member, and that guides the movement of the second movable member with respect to the first movable member.

8. The extendable device according to claim 2, wherein the first ball screw has:
a threaded shaft that is rotatably fixed to the base member and that rotates according to the driving force supplied from the drive source; and
a nut that is attached to the threaded shaft, that is fixed to the first movable member, and that causes the first movable member to move along the threaded shaft as the threaded shaft rotates.

9. The extendable device according to claim 8, wherein the second ball screw has:
a nut that is fixed to the base member; and
a threaded shaft that is attached to the nut, that is rotatably fixed to the first movable member, and that rotates as the first movable member moves,
the third ball screw has:
a threaded shaft that is rotatably fixed to the first movable member and that rotates as a result of the rotation of the threaded shaft of the second ball screw being transmitted by the transmission mechanism; and
a nut that is attached to the threaded shaft, that is fixed to the second movable member via the through-hole of the first movable member, and that causes the second movable member to move along the threaded shaft as the threaded shaft rotates, and
the transmission mechanism has:
a first pulley that is attached to the threaded shaft of the second ball screw;
a second pulley that is attached to the threaded shaft of the third ball screw; and
a belt that couples together the first pulley and the second pulley.

10. The extendable device according to claim 9, wherein the first pulley and the second pulley are of different diameters.

11. The extendable device according to claim 10, wherein the threaded shaft of the second ball screw and the threaded shaft of the third ball screw have different thread groove pitches.

12. The extendable device according to claim 11, further comprising:
a second guide mechanism that is provided between the first movable member and the second movable member, and that guides the movement of the second movable member with respect to the first movable member.

13. The extendable device according to claim 1, wherein the first guide mechanism includes a first guide rail and a second guide rail, and
the first ball screw, the second ball screw, and the third ball screw are provided between the first guide rail and the second guide rail.

14. The extendable device according to claim 1, wherein the second guide mechanism includes a first guide rail and a second guide rail, and
the through-hole of the first movable member is provided between the first guide rail and the second guide rail.

* * * * *